US012272715B2

(12) United States Patent
Li et al.

(10) Patent No.: US 12,272,715 B2
(45) Date of Patent: Apr. 8, 2025

(54) HIGH REFLECTANCE ISOLATION STRUCTURE TO INCREASE IMAGE SENSOR PERFORMANCE

(71) Applicant: Taiwan Semiconductor Manufacturing Co., Ltd., Hsinchu (TW)

(72) Inventors: Sheng-Chan Li, Tainan (TW); Hau-Yi Hsiao, Chiayi (TW); Che Wei Yang, Hsinchu (TW); Sheng-Chau Chen, Tainan (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 583 days.

(21) Appl. No.: 17/353,003

(22) Filed: Jun. 21, 2021

(65) Prior Publication Data
US 2022/0310678 A1 Sep. 29, 2022

Related U.S. Application Data

(60) Provisional application No. 63/166,420, filed on Mar. 26, 2021.

(51) Int. Cl.
*H01L 27/146* (2006.01)
*H01L 21/768* (2006.01)

(52) U.S. Cl.
CPC .... *H01L 27/1464* (2013.01); *H01L 21/76843* (2013.01); *H01L 21/76877* (2013.01);
(Continued)

(58) Field of Classification Search
CPC ............ H01L 27/1464; H01L 27/1463; H01L 21/76877; H01L 21/76879
See application file for complete search history.

(56) References Cited

U.S. PATENT DOCUMENTS 9,684,236 B1 6/2017 Hsieh et al.
9,704,904 B2 * 7/2017 Lai ...................... H01L 27/1464
(Continued)

FOREIGN PATENT DOCUMENTS

WO 2019108945 A1 6/2019

OTHER PUBLICATIONS

Ahmed et al. "MOS Capacitor Deep Trench Isolation for CMOS Image Sensors" 2014 IEEE International Electron Devices Meeting, published on Feb. 23, 2015.

*Primary Examiner* — Mounir S Amer
*Assistant Examiner* — Alexander Belousov
(74) *Attorney, Agent, or Firm* — Eschweiler & Potashnik, LLC (57) ABSTRACT

Various embodiments of the present disclosure are directed towards an image sensor having a semiconductor substrate comprising a front-side surface opposite a back-side surface. A plurality of photodetectors is disposed in the semiconductor substrate. An isolation structure extends into the back-side surface of the semiconductor substrate and is disposed between adjacent photodetectors. The isolation structure includes a metal core, a conductive liner disposed between the semiconductor substrate and the metal core, and a first dielectric liner disposed between the conductive liner and the semiconductor substrate. The metal core comprises a first metal material and the conductive liner comprises the first metal material and a second metal material different from the first metal material.

20 Claims, 10 Drawing Sheets

(52) U.S. Cl.
CPC .. *H01L 21/76898* (2013.01); *H01L 27/14636* (2013.01); *H01L 27/14685* (2013.01)

(56) References Cited

U.S. PATENT DOCUMENTS

| | | | |
|---|---|---|---|
| 9,871,070 B2* | 1/2018 | Hsu | H01L 27/1463 |
| 10,177,187 B2* | 1/2019 | Kalnitsky | H01L 27/1463 |
| 10,644,060 B2* | 5/2020 | Cheng | H01L 27/1463 |
| 2014/0264709 A1* | 9/2014 | Tsai | H01L 25/0657 |
| | | | 438/26 |
| 2017/0062496 A1* | 3/2017 | Lai | H01L 27/1464 |
| 2017/0271160 A1 | 9/2017 | Yen et al. | |
| 2018/0076081 A1 | 3/2018 | Cheng et al. | |
| 2018/0096936 A1* | 4/2018 | Wu | H01L 21/02271 |
| 2019/0019832 A1 | 1/2019 | Zhao et al. | |
| 2019/0067355 A1 | 2/2019 | Li et al. | |
| 2019/0096951 A1* | 3/2019 | Cheng | H01L 27/14632 |
| 2019/0115388 A1 | 4/2019 | Jung et al. | |
| 2019/0259797 A1 | 8/2019 | Li et al. | |
| 2020/0105812 A1 | 4/2020 | Sze | |
| 2020/0251510 A1* | 8/2020 | Ge | H01L 27/14621 |
| 2020/0350355 A1 | 11/2020 | Raynor et al. | |
| 2021/0288086 A1* | 9/2021 | Li | H01L 27/14685 |
| 2022/0310678 A1* | 9/2022 | Li | H01L 21/76843 |

* cited by examiner

HIGH REFLECTANCE ISOLATION STRUCTURE TO INCREASE IMAGE SENSOR PERFORMANCE

REFERENCE TO RELATED APPLICATION

This application claims the benefit of U.S. Provisional Application No. 63/166,420, filed on Mar. 26, 2021, the contents of which are hereby incorporated by reference in their entirety.

BACKGROUND

Many modern-day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide semiconductor image sensor (CIS) includes a plurality of photodetectors disposed in a device region of a semiconductor substrate. In an effort to improve the CIS, device geometries may be scaled down to achieve lower fabrication costs and increase device density. Due to the device scaling, a size of each photodetectors is decreased and the photodetectors are closer to one another. Electrical and optical isolation between adjacent photodetectors may be implemented to reduce blooming and increase quantum efficiency (QE) in the CIS. A trench isolation structure is disposed in/over a back-side surface of the semiconductor substrate and is disposed laterally between adjacent photodetectors. Further, deep implant wells may be formed through a depth of the photodetectors. The trench isolation structure and the deep implant wells are configured to increase isolation between the photodetectors, thereby increasing an overall performance of the CIS and facilitating scaling down of device features.

Challenges with the above CIS include cross-talk between adjacent photodetectors and increased fabrication costs. For example, the trench isolation structure may comprise one or dielectric materials disposed within trenches of the semiconductor substrate. The one or more dielectric materials of the trench isolation structure have relatively low reflectivity (e.g., about 29% or less) such that incident light disposed on a first photodetector may traverse a segment of the trench isolation structure to a second photodetector that is laterally adjacent to the first photodetector. This, in part, increases cross-talk between laterally adjacent photodetectors, thereby degrading a performance of the CIS. Further, dopants of the deep implant wells may diffuse out of the deep implant wells into other regions of the semiconductor substrate (e.g., into regions of the photodetectors), thereby increasing a size of the deep implant wells and decreasing a size of the photodetectors. The out-diffusion of the dopants reduces a full well capacity (e.g., the amount of charge a photodetector can accumulate before saturation) of the photodetectors because the size of the photodetectors has been decreased. In addition, formation of the deep implant wells may increase a complexity, time, and cost associated with fabrication of the CIS.

Accordingly, various embodiments of the present disclosure are directed towards an image sensor comprising a trench isolation structure that increases optical and electrical isolation between the photodetectors. The image sensor includes a plurality of photodetectors disposed within a substrate. The trench isolation structure extends into a surface of the substrate to a position below the surface of the substrate and is disposed laterally between each photodetector. The trench isolation structure comprises a conductive liner (e.g., comprising titanium, aluminum, another suitable conductive material, or any combination of the foregoing) and a metal core (e.g., comprising aluminum). In various embodiments, the conductive liner may function as a seed layer and/or a diffusion barrier layer for the metal core. One or more dielectric liner(s) is/are disposed between the substrate and the conductive liner. By virtue of the trench isolation structure comprising the conductive liner and the metal core, cross-talk between adjacent photodetectors may be reduced. For example, the metal material(s) of the metal core and/or conductive liner have relatively high reflectivity (e.g., greater than or equal to about 80%) such that incident light disposed on a first photodetector is impeded from traversing a segment of the trench isolation structure to a second photodetector laterally adjacent to the first photodetector.

In addition, the image sensor includes a bias circuit that is electrically coupled to the trench isolation structure and is configured to apply a bias voltage (e.g., a negative bias) to the metal core. In some embodiments, when a negative bias (e.g., about −3 volts) is applied to the metal core, leak current and cross-talk between adjacent photodetectors are further reduced. Further, by including the bias circuit and applying the bias voltage (e.g. about −3 volts) to the trench isolation structure, fabrication of the deep well implants may be omitted, thereby reducing fabrication costs and increasing the full well capacity of the photodetectors.

Figure 1:
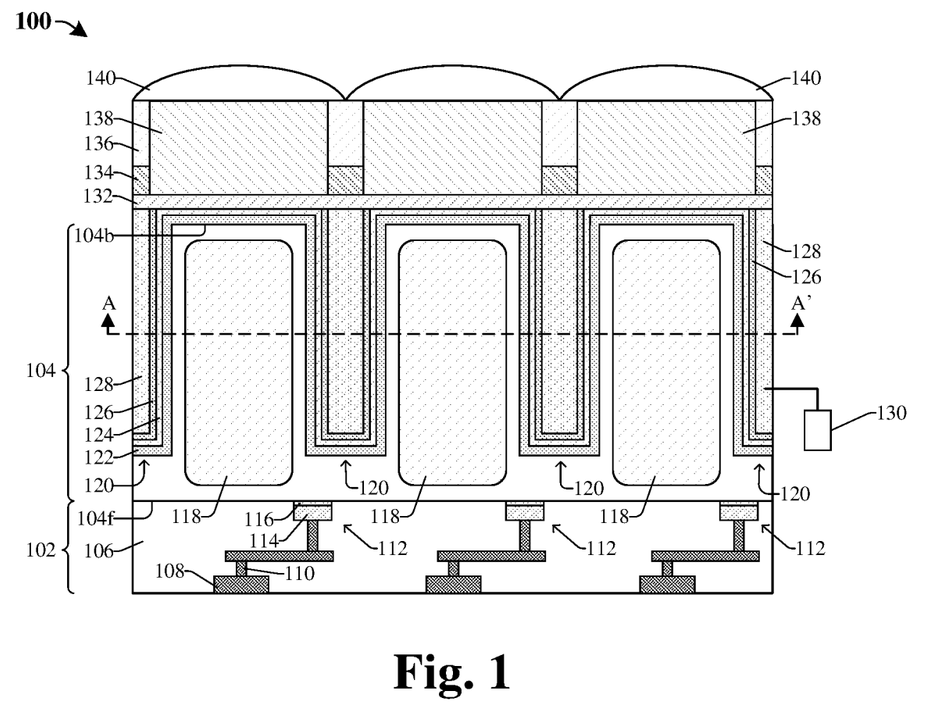
FIG. 1 illustrates a cross-sectional view of some embodiments of an image sensor comprising an isolation structure laterally enclosing a plurality of photodetectors and a bias circuit configured to bias the isolation structure.

FIG. 1 illustrates a cross-sectional view of some embodiments of an image sensor 100 comprising an isolation structure 120 laterally enclosing a plurality of photodetectors 118 and a bias circuit 130 configured to bias the isolation structure 120.

The image sensor 100 includes an interconnect structure 102 disposed along a front-side surface 104f of a substrate 104. In some embodiments, the substrate 104 comprises any semiconductor body (e.g., bulk silicon) and/or has a first doping type (e.g., p-type doping). The interconnect structure 102 comprises an interconnect dielectric structure 106, a plurality of conductive wires 108, and a plurality of conductive vias 110. A plurality of pixel devices 112 is disposed along the front-side surface 104f of the substrate 104 and the pixel devices 112 are electrically coupled to one another and/or other semiconductor devices (not shown) by way of the plurality of conductive wires and vias 108, 110. The plurality of pixel devices 112 may comprise a gate electrode 114 and a gate dielectric layer 116 disposed between the gate electrode 114 and the front-side surface 104f of the substrate 104.

The plurality of photodetectors 118 are disposed within a pixel array region of the substrate 104 and may comprise a second doping type (e.g., n-type) opposite the first doping type (e.g., p-type doping). In various embodiments, the first doping type is p-type and the second doping type is n-type, or vice versa. The plurality of photodetectors 118 are configured to absorb incident light (e.g., photons) and generate respective electrical signals corresponding to the incident light. In such embodiments, the photodetectors 118 may generate electron-hole pairs from the incident light. The plurality of pixel devices 112 may be configured to conduct readout of the generated electrical signals from the plurality of photodetectors 118 by way of the interconnect structure 102.

The isolation structure 120 extends into a back-side surface 104b of the substrate 104 to a point below the back-side surface 104b and laterally encloses each photodetector in the plurality of photodetectors 118. An upper dielectric layer 132 overlies the back-side surface 104b of the substrate 104 and the isolation structure 120. A metal grid structure 134 overlies the back-side surface 104b of the substrate 104 and a dielectric grid structure 136 overlies the metal grid structure 134. In various embodiments, the metal grid structure 134 and the dielectric grid structure 136 comprise sidewalls defining a plurality of openings that directly overlie a corresponding photodetector in the plurality of photodetectors 118. The metal grid structure 134 comprises one or more metal layers that is/are configured to reduce cross talk between adjacent photodetectors 118. Further, the dielectric grid structure 136 may be configured to direct the incident light to a corresponding underlying photodetector 118 by total internal reflection (TIR), thereby further reducing cross talk and increasing a quantum efficiency (QE) of the photodetectors 118. In yet further embodiments, color filters 138 are disposed within the openings of the metal grid structure 134 and the dielectric grid structure 136. The color filters 138 are configured to transmit specific wavelengths of incident light while blocking other wavelengths of incident light. Further, a plurality of micro-lenses 140 overlies the color filters 138 and is configured to focus the incident light towards the photodetectors 118.

The isolation structure 120 is disposed between adjacent photodetectors 118. The isolation structure 120 is configured to electrically isolate the photodetectors 118 from one another and is configured to reduce cross-talk between adjacent photodetectors 118. In various embodiments, the isolation structure 120 comprises a first dielectric liner 122, a second dielectric liner 124, a conductive liner 126, and a metal core 128. The first dielectric liner 122 lines sidewalls of one or more trench(es) that extend into the back-side surface 104b of the substrate 104, and the second dielectric liner 124 is disposed along the first dielectric liner 122. In various embodiments, the first dielectric liner 122 comprises a first dielectric material (e.g., a high-k dielectric material) and the second dielectric liner 124 comprises a second dielectric material (e.g., an oxide such as silicon dioxide) different from the first dielectric material.

The conductive liner 126 extends into the one or more trench(es) and is disposed along the second dielectric liner 124. Further, the metal core 128 is disposed within the one or more trench(es) and the conductive liner 126 is disposed between the metal core 128 and the second dielectric liner 124. In some embodiments, the conductive liner 126 is configured as a seed layer and/or a diffusion barrier layer for the metal core 128. In addition, the metal core 128 comprises a metal material (e.g., aluminum) with a relatively high reflectivity (e.g., greater than or equal to about 80%) that facilitates the reduction of cross-talk between adjacent photodetectors. For example, incident light may be disposed on the back-side surface 104b at an angle relative to the back-side surface 104b, and the metal core 128 is configured to impede the incident light disposed directly above a corresponding photodetector from traversing a segment of the isolation structure 120 to an adjacent photodetector. This, in part, is because the metal core 128 comprises the metal material that facilitates reflection of the incident light disposed at the angle back towards the corresponding photodetector (where the incident light is reflected away from the adjacent photodetector). Thus, cross-talk is reduced and the QE of the photodetectors 118 is increased, thereby increasing a performance of the image sensor 100.

Further, the bias circuit 130 is electrically coupled to the metal core 128 and the substrate 104. The bias circuit 130 is configured to apply a bias voltage (e.g., a negative bias voltage) to the metal core 128. In various embodiments, the bias circuit 130 may be electrically coupled to the metal core 128 by way of a through substrate via (TSV) (not shown) and/or the interconnect structure 102 (e.g., see FIGS. 5A and 5B). In various embodiments, the bias voltage is about −3 volts, within a range of about −20 volts to +20 volts, or another suitable value. During operation of the image sensor 100, the bias circuit 130 applies a bias voltage (e.g., a negative bias of about −3 volts) which generates electron hole accumulation along sidewalls of the isolation structure 120 (i.e., along sidewalls of the first dielectric liner 122) and prevents electrons from being trapped near the isolation structure 120, thereby reducing leakage current as well as a further reduction in cross-talk between adjacent photodetectors 118. In addition, by generating electron hole accumulation along sidewalls of the isolation structure 120, a full well capacity of each photodetector in the plurality of photodetectors 118 is increased.

Furthermore, because the bias circuit 130 increases the full well capacity of the photodetectors 118 by applying the negative bias, fabrication of deep implant wells (not shown) around each of the photodetectors 118 may be omitted. This mitigates an out-diffusion of dopants from the deep implant wells and decreases costs associated with fabricating the image sensor 100, thereby increasing an overall performance of the photodetectors 118. In addition, the conductive liner 126 comprises a conductive material (e.g., titanium, aluminum, copper, another conductive material, or any combination of the foregoing) and is configured to function as a seed layer for the metal core 128. As such, the conductive liner 126 facilitates proper growth or deposition of the metal core 128 within the one or more trench(es), thereby mitigating the formation of voids within the metal core 128. This, in part, prevents delamination of the metal core 128 from the conductive liner 126, the second dielectric liner 124, and/or the first dielectric liner 122 and increases a structural integrity of the metal core 128, thereby ensuring that the negative bias may be properly applied to the metal core 128 by the bias circuit 130. Accordingly, a performance and endurance of the image sensor 100 is increased.

In some embodiments, the isolation structure 120 may be referred to as a deep trench isolation (DTI) structure or a back-side DTI structure. In addition, the first dielectric liner 122 and the second dielectric liner 124 may be referred to as a dielectric isolation structure of the isolation structure 120.

Figure 2:
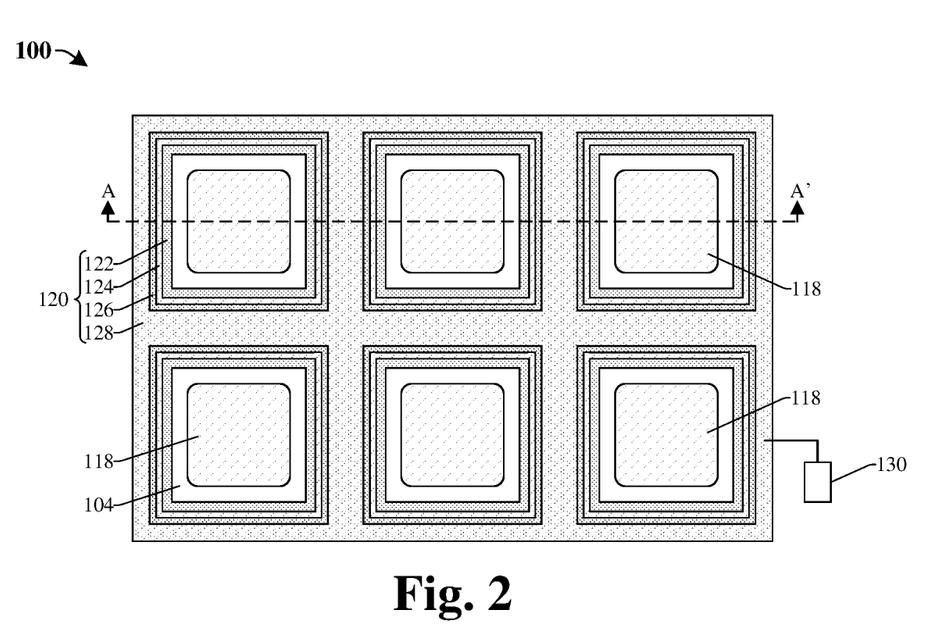
FIG. 2 illustrates a top view of some embodiments of the image sensor of FIG. 1 taken along the line A-A'.

FIG. 2 illustrates a top view of some embodiments of the image sensor 100 taken along the line A-A' of FIG. 1. In various embodiments, FIG. 1 illustrates some embodiments of a cross-sectional view of the image sensor 100 taken along the line A-A' of FIG. 2.

In some embodiments, the isolation structure 120 is arranged in an isolation grid such that the metal core 128 laterally encloses each photodetector 118. The photodetectors 118 are respectively disposed between opposing sidewalls of the metal core 128. In further embodiments, the metal grid structure (134 of FIG. 1) and the dielectric grid structure (136 of FIG. 1) directly overlie the isolation structure 120 and each have a same shape and/or layout as the metal core 128 when viewed from above. Thus, the metal grid structure (134 of FIG. 1) and the dielectric grid structure (136 of FIG. 1) each have a grid shape when viewed from above that corresponds to a shape and/or layout of the metal core 128.

Figure 3:
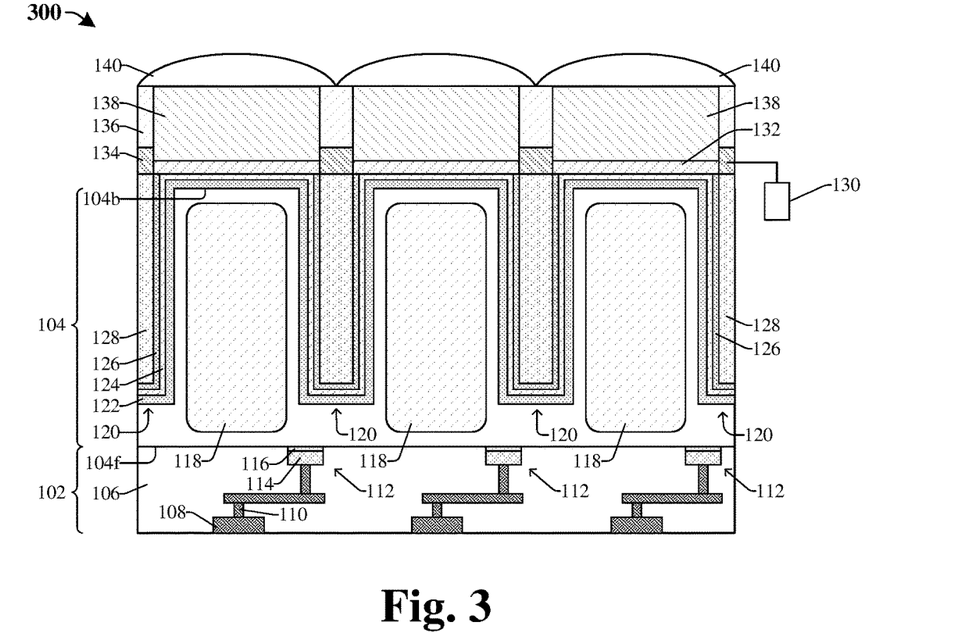
FIG. 3 illustrates a cross-sectional view of some embodiments of an image sensor comprising an isolation structure laterally enclosing a plurality of photodetectors, a metal grid structure contacting the isolation structure, and a bias circuit configured to bias the isolation structure.

FIG. 3 illustrates a cross-sectional view of some embodiments of an image sensor 300 corresponding to some embodiments of the image sensor 100 of FIG. 1, in which the metal grid structure 134 directly contacts the metal core 128 of the isolation structure 120.

In some embodiments, the metal grid structure 134 is electrically coupled to the metal core 128 of the isolation structure 120 and the bias circuit 130 is electrically coupled to the metal core 128 by way of the metal grid structure 134. Thus, the bias circuit 130 may apply the negative bias to the isolation structure 120 by way of the metal grid structure 134. In various embodiments, the substrate 104 may, for example, be or comprise monocrystalline silicon, epitaxial silicon, silicon-germanium (SiGe), a silicon-on-insulator (SOI) substrate, another semiconductor material, or the like. The isolation structure 120 comprises the first dielectric liner 122, the second dielectric liner 124, the conductive liner 126, and the metal core 128. In some embodiments, the first dielectric liner 122 may be or comprise a high-k dielectric material, hafnium oxide, titanium oxide, aluminum oxide, strontium titanium oxide, zirconium oxide, hafnium silicate (e.g., $HfSiO_4$), lanthanum oxide, yttrium oxide, another dielectric material, or any combination of the foregoing. As used herein, a high-k dielectric material is a dielectric material with a dielectric constant greater than 3.9. In further embodiments, the second dielectric liner 124 may comprise an oxide such as silicon dioxide, or the like. In yet further embodiments, the first dielectric liner 122 comprises a first dielectric material (e.g., a high-k dielectric material) and the second dielectric liner 124 comprises a second dielectric material (e.g., silicon dioxide), where the first dielectric material has a greater dielectric constant than the second dielectric material.

The conductive liner 126 may, for example, be or comprise titanium, aluminum, carbon, titanium aluminum carbide, titanium aluminum, another conductive material, or any combination of the foregoing. The metal core 128 may, for example, be or comprise copper, silver, gold, tungsten, aluminum, or the like. In various embodiments, the metal core 128 may consist essentially of aluminum. In further embodiments, the metal core 128 comprises a first metal material (e.g., aluminum) and the conductive liner 126 may comprise the first metal material and a second metal material different from the first metal material. For example, the conductive liner 126 may be or comprise titanium aluminum carbide. In addition, the upper dielectric layer 132 may, for example, be or comprise an oxide such as silicon dioxide, or the like. In various embodiments, the upper dielectric layer 132 may comprise the second dielectric material (e.g., silicon dioxide) and may be part of the second dielectric liner 124. In yet further embodiments, sidewalls of the metal core 128 are aligned with sidewalls of the metal grid structure 134 and/or are aligned with sidewalls of the dielectric grid structure 136.

Figure 4:
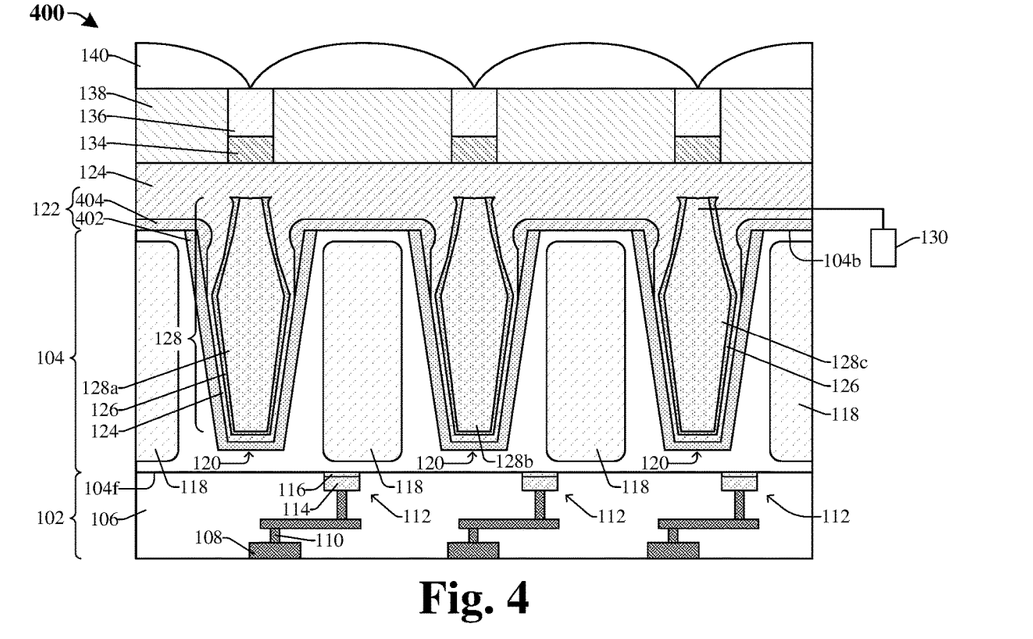
FIG. 4 illustrates a cross-sectional view of some other embodiments of the image sensor of FIG. 1.

FIG. 4 illustrates a cross-sectional view of some embodiments of an image sensor 400 corresponding to some embodiments of the image sensor 100 of FIG. 1, in which the metal core 128 has a plurality of metal segments 128a-c that respectively have a hexagon shape. It will be appreciated that the metal segments 128a-c may respectively have any polygon shape such as a rectangular shape, a diamond shape, a pentagon shape, a hexagon shape, or the like. Further, top surfaces of the metal core 128 and the conductive liner 126 are disposed vertically above the back-side surface 104b of the substrate 104. In further embodiments, a width of each metal segment 128a-c of the metal core 128 continuously increases from the top surface of the metal core 128 to a first point vertically below the back-side surface 104b of the substrate 104, and the width of each metal segment 128a-c continuously decreases from the first point to a bottom surface of the metal core 128. In various embodiments, a first width of a top surface of each metal segment 128a-c is less than a second width of a bottom surface of each metal segment 128a-c.

Further, the first dielectric liner 122 comprises a first dielectric layer 402 and a second dielectric layer 404 overlying the first dielectric layer 402. The first dielectric layer 402 lines opposing sidewalls and a lower surface of the substrate 104 that defines the one or more trench(es). In yet further embodiments, a top surface of the first dielectric layer 402 is aligned with the back-side surface 104b of the substrate 104. The second dielectric layer 404 extends from along the back-side surface 104b of the substrate 104 to inner sidewalls of the first dielectric layer 402. In various embodiments, the first dielectric layer 402 and the second dielectric layer 404 respectively comprise a same dielectric material (e.g., a high-k dielectric material). In yet further embodiments, a top surface of the conductive liner 126 is disposed vertically above the top surfaces of the metal core 128 and the conductive liner 126.

Figure 5A:
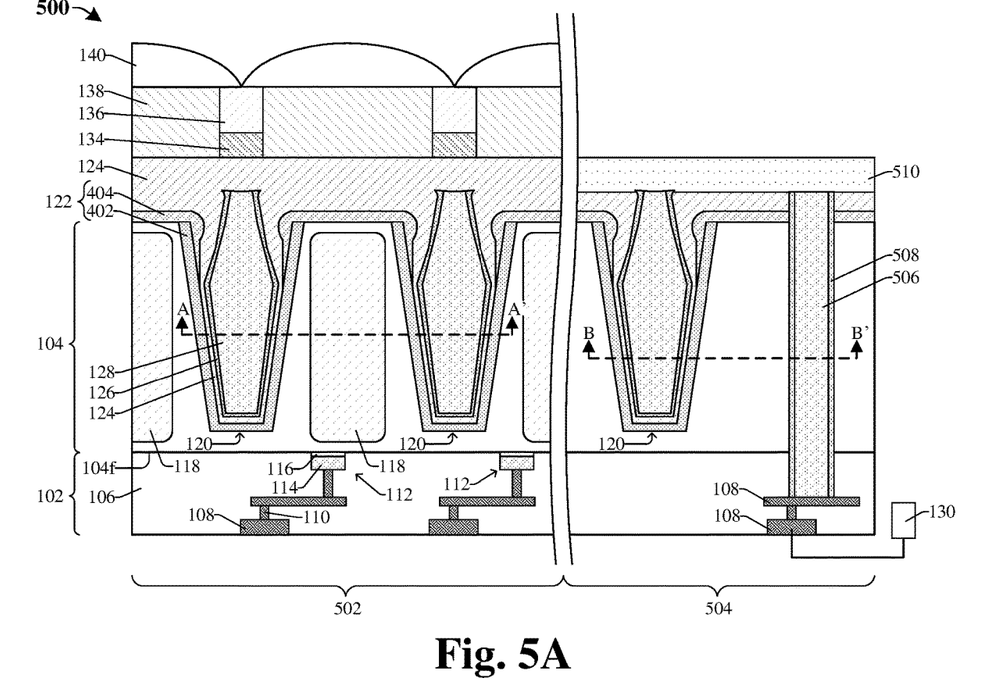
FIGS. 5A and 5B illustrate various views of some embodiments of an image sensor comprising a substrate having a pixel array region laterally adjacent to a peripheral region.
Figure 5B:
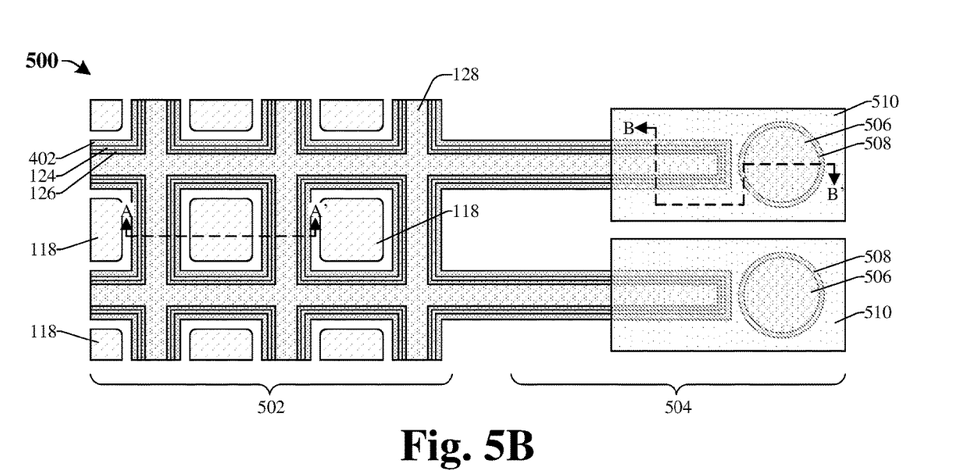

FIGS. 5A and 5B illustrate various views of some embodiments of an image sensor 500 comprising an isolation structure 120 laterally enclosing a plurality of photodetectors 118 and a bias circuit 130 configured to bias the isolation structure 120. The image sensor 500 of FIGS. 5A and 5B may correspond to some embodiments of the image sensor 400 of FIG. 4. FIG. 5A illustrates some embodiments of a cross-sectional view of the image sensor 500 as indicated by lines A-A' and B-B' of FIG. 5B. FIG. 5B illustrates some embodiments of a top view of the image sensor 500 as indicated by lines A-A' and B-B' of FIG. 5A.

The plurality of photodetectors 118 are disposed within a pixel array region 502 of the substrate 104 that is laterally adjacent to a peripheral region 504 of the substrate 104. In various embodiments, the metal core 128 of the isolation structure 120 continuously laterally extends from the pixel array region 502 to the peripheral region 504. A through-substrate via (TSV) 506 is disposed within the peripheral region 504 and is electrically coupled to the metal core 128. In various embodiments, the metal core 128 may directly contact the TSV 506 (not shown). Further, an upper conductive structure 510 is disposed laterally within the peripheral region 504 and directly overlies the TSV 506. In various embodiments, the upper conductive structure 510 may be configured as a bond pad and may electrically couple the image sensor 500 to another integrated circuit (not shown) or other semiconductor devices (not shown). The upper conductive structure 510 is configured to electrically couple the metal core 128 of the isolation structure 120 to the TSV 506, and the TSV 506 is electrically coupled to an underlying conductive wire 108 within the interconnect structure 102. Thus, in various embodiments, the metal core 128 may be electrically coupled to the bias circuit 130 by way of the upper conductive structure 510, the TSV 506, and/or the interconnect structure 102. Further, a third dielectric liner 508 is disposed within the peripheral region 504 and laterally encloses the TSV 506. The third dielectric liner 508 is configured to electrically isolate the TSV 506 from other devices and/or structures disposed within and/or on the substrate 104. In yet further embodiments, the third dielectric liner 508 laterally separates the metal core 128 from the TSV 506. In various embodiments, the TSV 506 may be referred to as a negative bias terminal, and the upper conductive structure 510 may be referred to as a negative bias pad or a negative bias contact.

Figure 6A:
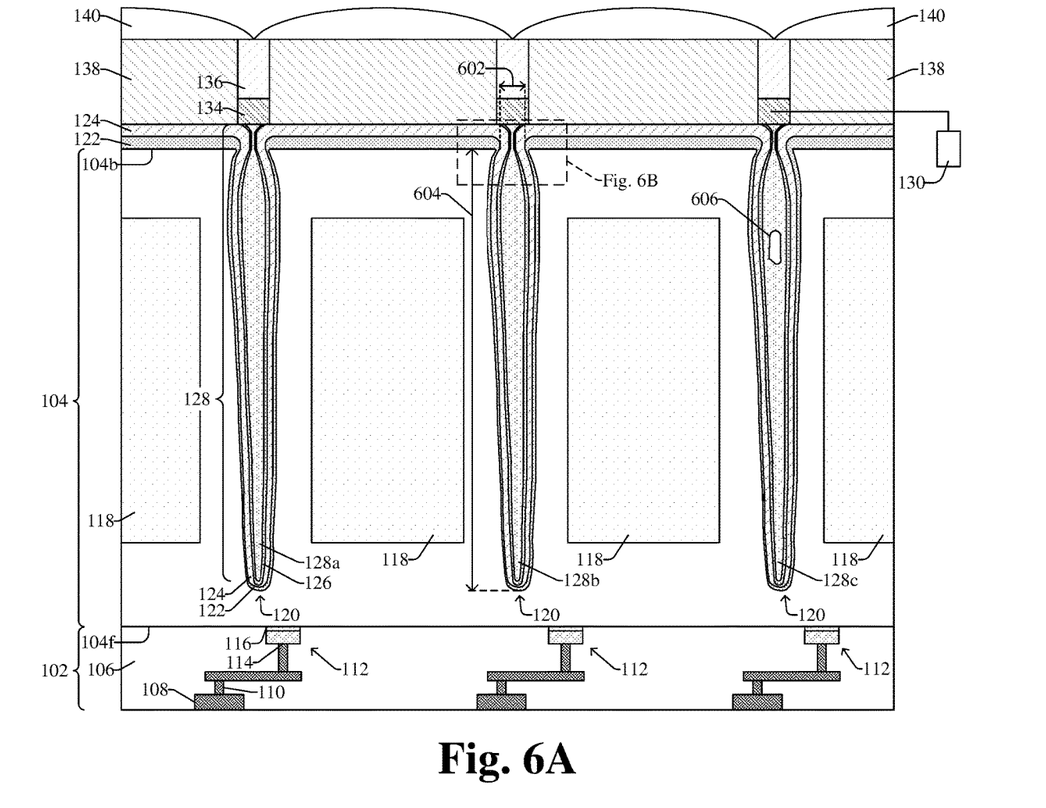
FIG. 6A illustrates a cross-sectional view of some embodiments of an image sensor comprising an isolation structure laterally enclosing a plurality of photodetectors and a bias circuit configured to bias the isolation structure.

FIG. 6A illustrates a cross-sectional view of some embodiments of an image sensor 600 corresponding to some embodiments of the image sensor 100 of FIG. 1, in which the metal core 128 has a plurality of metal segments 128a-c disposed within the substrate 104. In various embodiments, a width of each metal segment 128a-c continuously decreases from a bottom surface of the metal grid structure 134 to the back-side surface 104b of the substrate 104. In further embodiments, a curved sidewall of each metal segment 128a-c directly overlies the conductive liner 126. A first distance 602 is defined between opposing sidewalls of the first dielectric liner 122 and above a segment of the trench in which a middle metal segment 128b of the metal core 128 is disposed. In various embodiments, the first distance 602 is about 60 nanometers (nm), within a range of about 50 nm to 70 nm, or another suitable value. Further, a height 604 of the metal segments 128a-c disposed within the substrate 104 is about 2 micrometers (um), within a range of about 1.9 um to about 2.1 um, or another suitable value. In yet further embodiments, an outer metal segment 128c comprises sidewalls that define a void 606 disposed within the trench of the substrate 104.

Figure 6B:
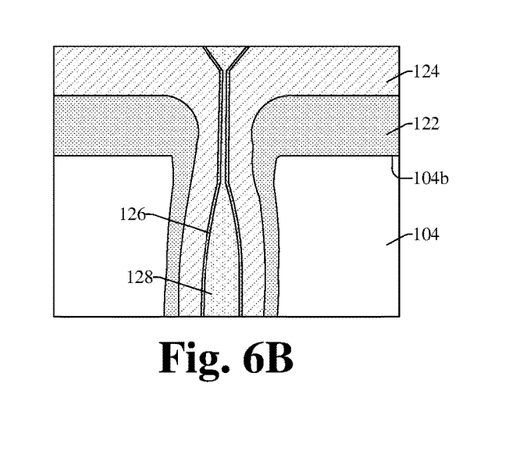
FIG. 6B illustrates a cross-sectional view of some embodiments of a section of the image sensor of FIG. 6A.

FIG. 6B illustrates a cross-sectional view of some embodiments of a section of the image sensor 600 of FIG. 6A, where an upper portion of the metal core 128 is disposed above a top surface of the first dielectric liner 122 and comprises opposing sidewalls that directly overlies the second dielectric liner 124. The metal core 128 continuously extends from a first point aligned with a top surface of the second dielectric liner 124 to a second point below the back-side surface 104b of the substrate 104.

FIGS. 7-16 illustrate cross-sectional views 700-1600 of some embodiments of a method for forming an image sensor comprising an isolation structure laterally enclosing a plurality of photodetectors and a bias circuit configured to bias the isolation structure according to the present disclosure. Although the cross-sectional views 700-1600 shown in FIGS. 7-16 are described with reference to the method, it will be appreciated that the structures shown in FIGS. 7-16 are not limited to the method but rather may stand alone separate of the method. Furthermore, although FIGS. 7-16 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 7:
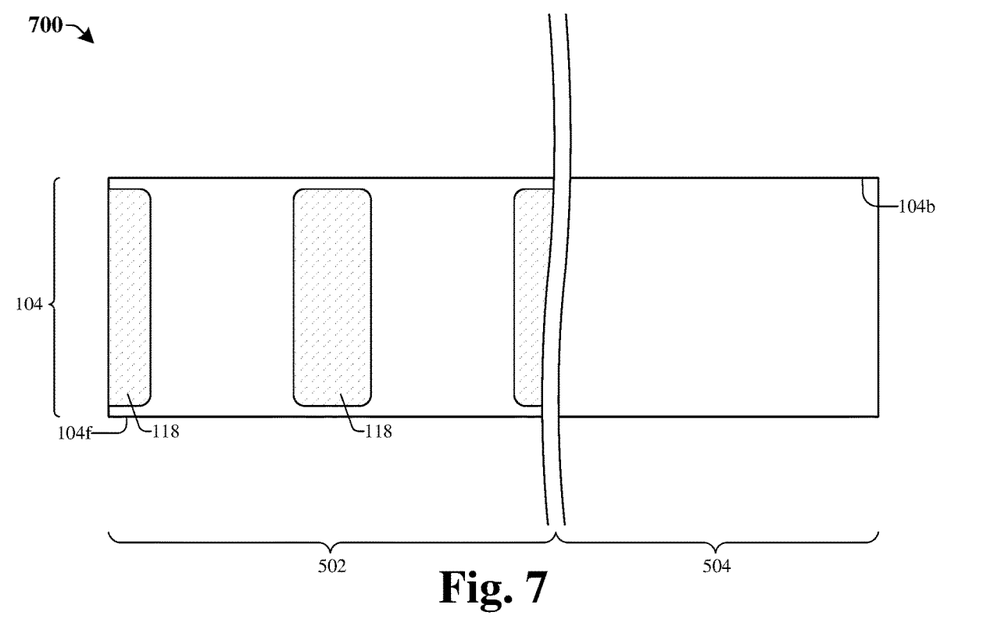
FIGS. 7-16 illustrate cross-sectional views of some embodiments of a method for forming an image sensor comprising an isolation structure laterally enclosing a plurality of photodetectors and a bias circuit configured to bias the isolation structure.

As illustrated in cross-sectional view 700 of FIG. 7, a plurality of photodetectors 118 is formed within a pixel array region 502 of a substrate 104. In some embodiments, the substrate 104 may, for example, be or comprise a bulk silicon substrate, monocrystalline silicon, epitaxial silicon, silicon germanium (SiGe), or another suitable semiconductor material and/or comprises a first doping type (e.g., p-type). The substrate 104 comprises a front-side surface 104f that is opposite a back-side surface 104b. In various embodiments, a process for forming the plurality of photodetectors 118 includes: selectively forming a masking layer (not shown) over the front-side surface 104f of the substrate; performing a selective ion implantation process according to the masking layer, thereby implanting one or more dopants within the substrate 104 and forming the photodetectors 118; and performing a removal process to remove the masking layer (not shown). The one or more dopants may, for example, be or comprise phosphorus, arsenic, antimony, another suitable n-type dopant, or any combination of the foregoing with a second doping type (e.g., n-type). Thus, the photodetectors 118 comprise the second doping type (e.g., n-type). In various embodiments, the first doping type is p-type and the second doping type is n-type, or vice versa.

Figure 8:
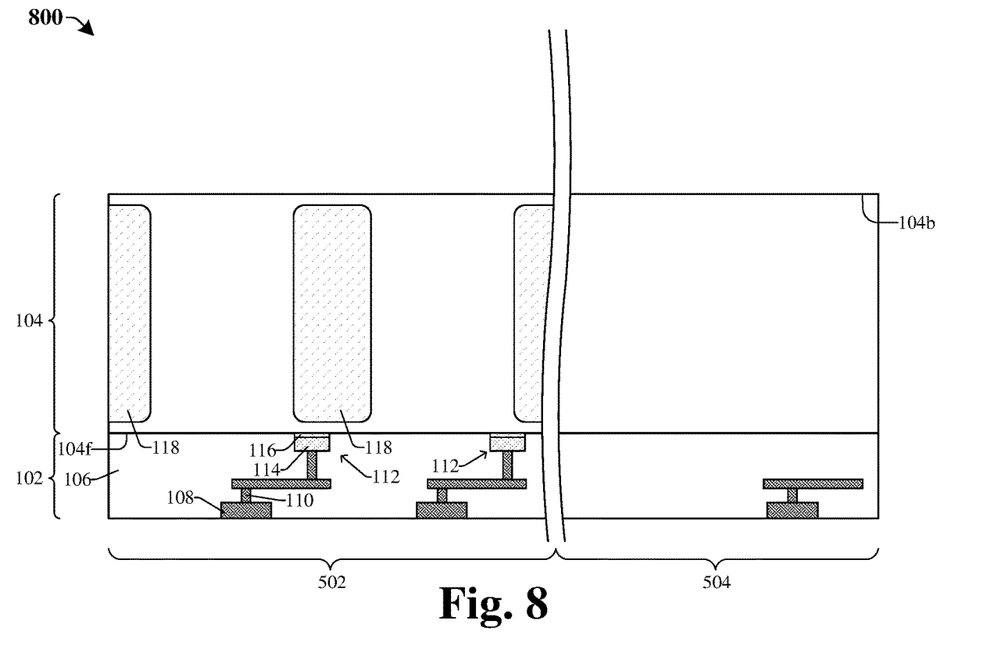

As illustrated in cross-sectional view 800 of FIG. 8, a plurality of pixel devices 112 and an interconnect structure 102 are formed along the front-side surface 104f of the substrate 104. In some embodiments, each pixel device 112 comprises a gate electrode 114 and a gate dielectric layer 116 disposed between the gate electrode 114 and the substrate 104. The interconnect structure 102 comprises an interconnect dielectric structure 106, a plurality of conductive wires 108, and a plurality of conductive vias 110. In various embodiments, the interconnect dielectric structure 106 may be formed by one or more deposition process(es) such as a physical vapor deposition (PVD) process, a chemical vapor deposition (CVD) process, an atomic layer deposition (ALD) process, another suitable growth or deposition process, or any combination of the foregoing. In further embodiments, the plurality of pixel devices 112, the plurality of conductive wires 108, and/or the plurality of conductive vias 110 may be formed by one or more deposition process(es), one or more patterning process(es), one or more planarization process(es), one or more ion implantation process(es), or some other suitable process(es).

Figure 9:
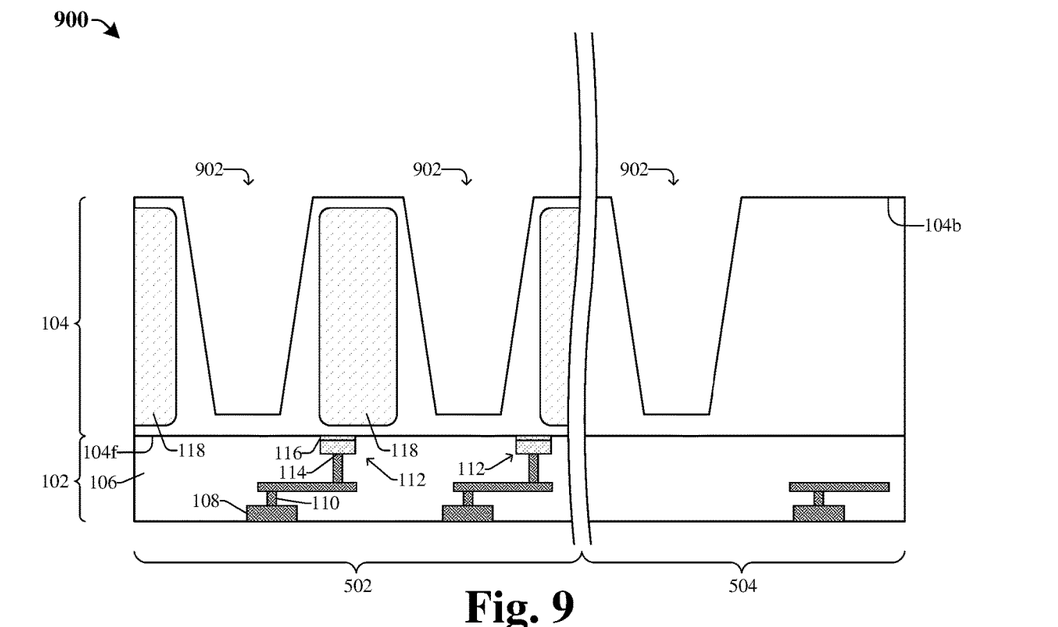

As illustrated in cross-sectional view 900 of FIG. 9, a patterning process is performed on the back-side surface 104b of the substrate 104 to define an isolation structure opening 902 extending from the back-side surface 104b to a point below the back-side surface 104b. In various embodiments, the isolation structure opening 902 may be referred to as a trench and the substrate 104 comprises opposing sidewalls and a lower surface defining the isolation structure opening 902. In some embodiments, the patterning process includes: forming a masking layer (not shown) over the back-side surface 104b of the substrate 104; etching the substrate 104 according to the masking layer, thereby defining the isolation structure opening 902; and performing a removal process to remove the masking layer (not shown). In such embodiments, the etching process may include performing a wet etch process, a dry etch process, another suitable etch process, or any combination of the foregoing.

Figure 10:
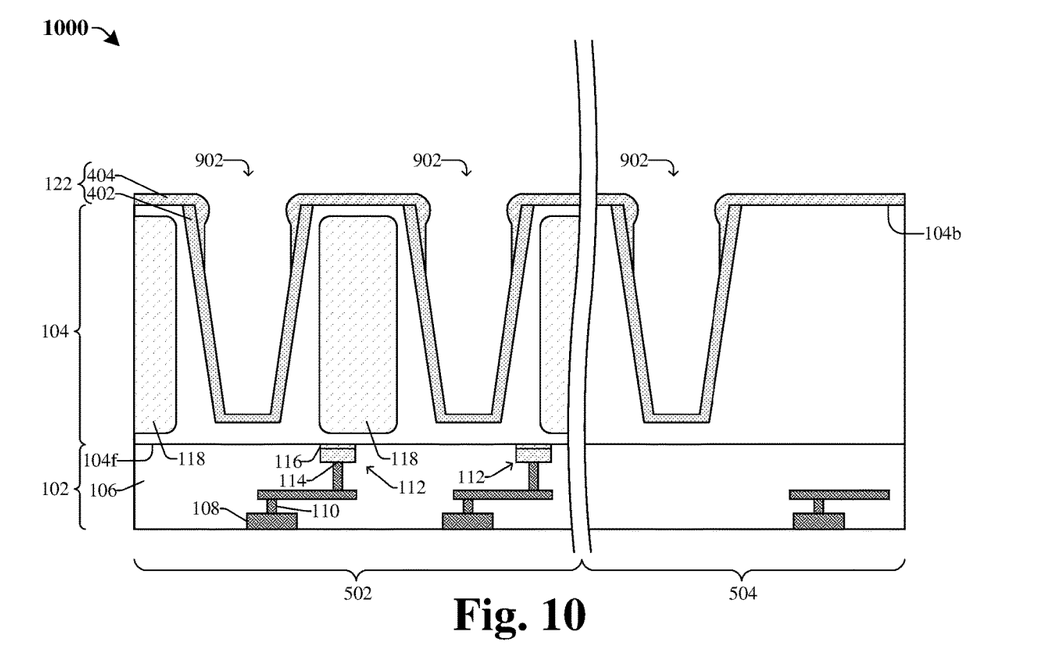

As illustrated in cross-sectional view 1000 of FIG. 10, a first dielectric liner 122 is formed over the substrate 104 such that the first dielectric liner 122 lines the isolation structure opening 902. The first dielectric liner 122 may be formed over the substrate 104 by one or more deposition process(es) such as a PVD process, a CVD process, an ALD process, or another suitable growth or deposition process. Further, the first dielectric liner 122 comprises a first dielectric layer 402 and a second dielectric layer 404, where the first dielectric layer 402 lines sidewalls of the substrate 104 that define the isolation structure opening 902 and the second dielectric layer 404 is disposed along the front-side surface 104f of the substrate 104. In yet further embodiments, a process for forming the first dielectric liner 122 includes: depositing the first dielectric layer 402 over the substrate 104 and within the isolation structure opening 902 by a first deposition process; performing a planarization process into the first dielectric layer 402; and depositing the second dielectric layer 404 over the substrate 104 and the first dielectric layer 402 by a second deposition process. In various embodiments, the first deposition process is different from the second deposition process. For example, the first deposition process may include performing an ALD process, a plasma enhanced ALD (PEALD) process, a CVD process, a metal organic CVD (MOCVD) process, or the like, and the second deposition process may include performing a PVD process, a plasma enhanced CVD (PECVD) process, or the like. In yet further embodiments, the planarization process may include an etching process, a chemical mechanical planarization (CMP) process, or the like and may be performed such that a top surface of the first dielectric layer 402 is co-planar with the back-side surface 104b of the substrate 104. In further embodiments, after depositing the second dielectric layer 404 over the substrate and the first dielectric layer 402, an etch back process may be performed to remove the second dielectric layer 404 from regions of the isolation structure opening 902.

The first dielectric layer 402 may, for example, be or comprise a high-k dielectric material, hafnium oxide, titanium oxide, aluminum oxide, strontium titanium oxide, zirconium oxide, hafnium silicate (e.g., HfSiO$_4$), lanthanum oxide, yttrium oxide, another dielectric material, or any combination of the foregoing. The second dielectric layer 404 may, for example, be or comprise a high-k dielectric material, hafnium oxide, titanium oxide, tantalum oxide, aluminum oxide, strontium titanium oxide, zirconium oxide, hafnium silicate (e.g., HfSiO$_4$), lanthanum oxide, yttrium oxide, another dielectric material, or any combination of the foregoing.

Figure 11:
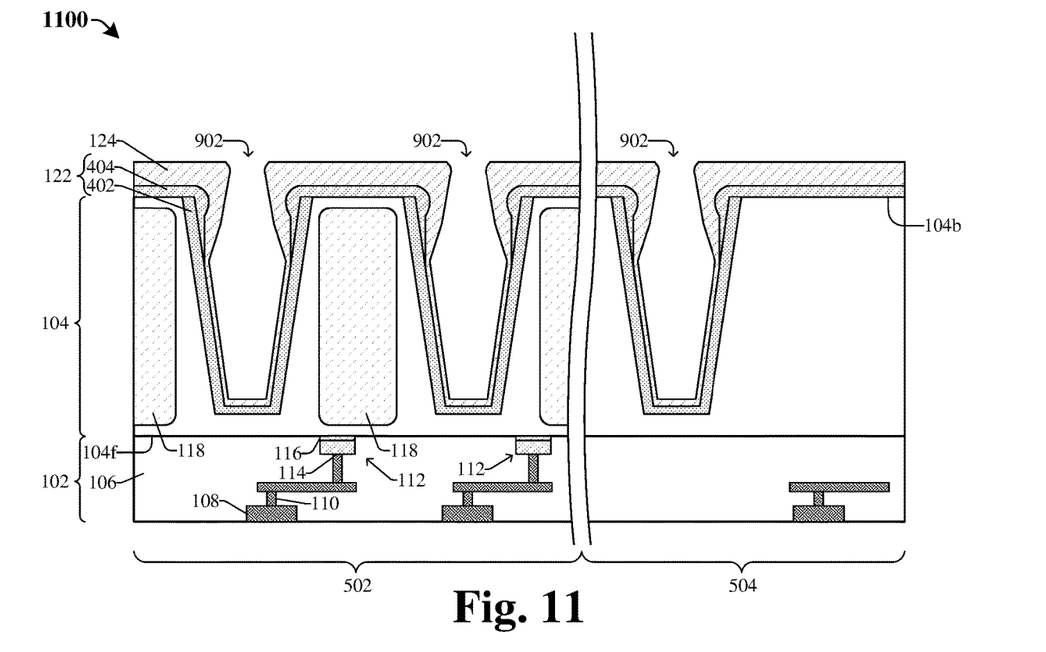

As illustrated in cross-sectional view 1100 of FIG. 11, a second dielectric liner 124 is formed over the first dielectric liner 122 such that the second dielectric liner 124 lines the isolation structure opening 902. In various embodiments, the second dielectric liner 124 is formed by a PECVD process, a PEALD process, an ALD process, a PVD process, or another suitable growth or deposition process. Further, the second dielectric liner 124 may, for example, be or comprise an oxide, such as silicon dioxide, or the like and has a dielectric constant less than that of the first dielectric layer 402 and the second dielectric layer 404, respectively.

Figure 12:
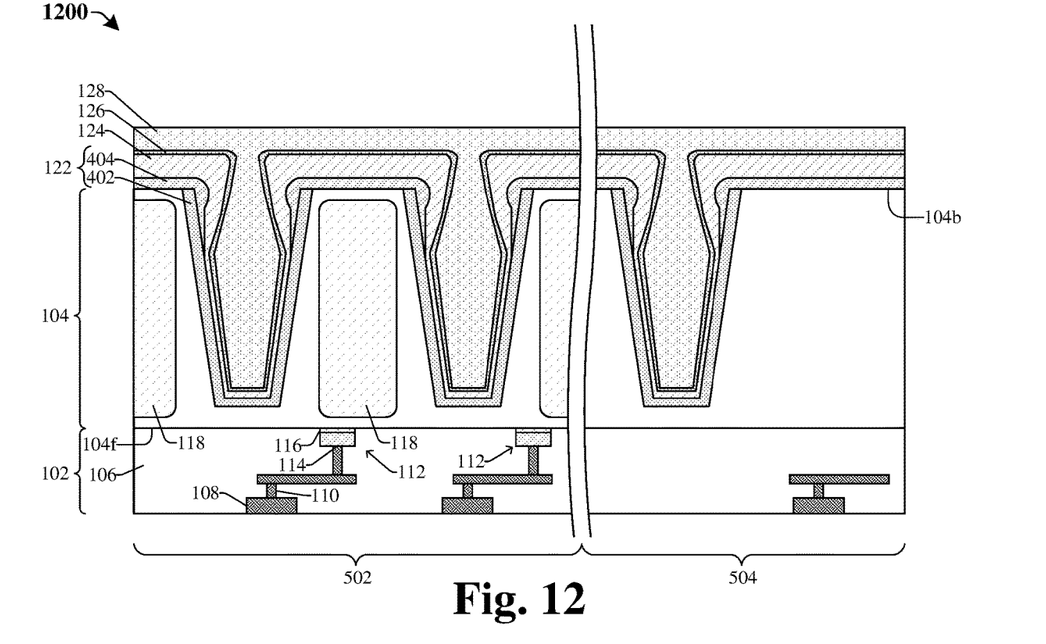

As illustrated in cross-sectional view 1200 of FIG. 12, a conductive liner 126 is formed over the back-side surface 104b of the substrate 104, and a metal core 128 is formed over the conductive liner 126. The conductive liner 126 lines the isolation structure opening (902 of FIG. 11), and the metal core 128 fills the isolation structure opening (902 of FIG. 11). In various embodiments, the conductive liner 126 is formed by a third deposition process and the metal core 128 is formed by a fourth deposition process that is different from the third deposition process. For example, the third deposition process may include performing an ALD process, and the fourth deposition process may include performing a CVD process. It will be appreciated that the conductive liner 126 and the metal core 128 may be formed by other deposition process(es) such as a PVD process, a CVD process, sputtering, electroplating, electroless plating, or another suitable deposition or growth process. In yet further embodiments, the conductive liner 126 may be configured as a seed layer that facilitates proper growth or deposition of the metal core 128 within the isolation structure opening (902 of FIG. 11), thereby mitigating the presence of voids within the metal core 128. This, in part, may increase a structural integrity of the metal core 128, facilitates a reduction of cross-talk between the photodetectors 118, and ensures a bias voltage (e.g., a negative bias) may be properly applied to the metal core 128. Further, the conductive liner 126 may also be configured as a diffusion barrier layer that mitigates diffusion of conductive material from the metal core 128 to the first dielectric liner 122, the second dielectric liner 124, and the substrate 104.

The conductive liner 126 may, for example, be or comprise titanium, aluminum, carbon, titanium aluminum carbide, titanium aluminum, another conductive material, or any combination of the foregoing. The metal core 128 may, for example, be or comprise copper, silver, gold, tungsten, aluminum, or the like. In various embodiments, the metal core 128 may consist essentially of aluminum. In further embodiments, the metal core 128 comprises a first metal material (e.g., aluminum) and the conductive liner 126 may comprise the first metal material and a second metal material different from the first metal material. For example, the conductive liner 126 may be or comprise titanium aluminum carbide.

Figure 13:
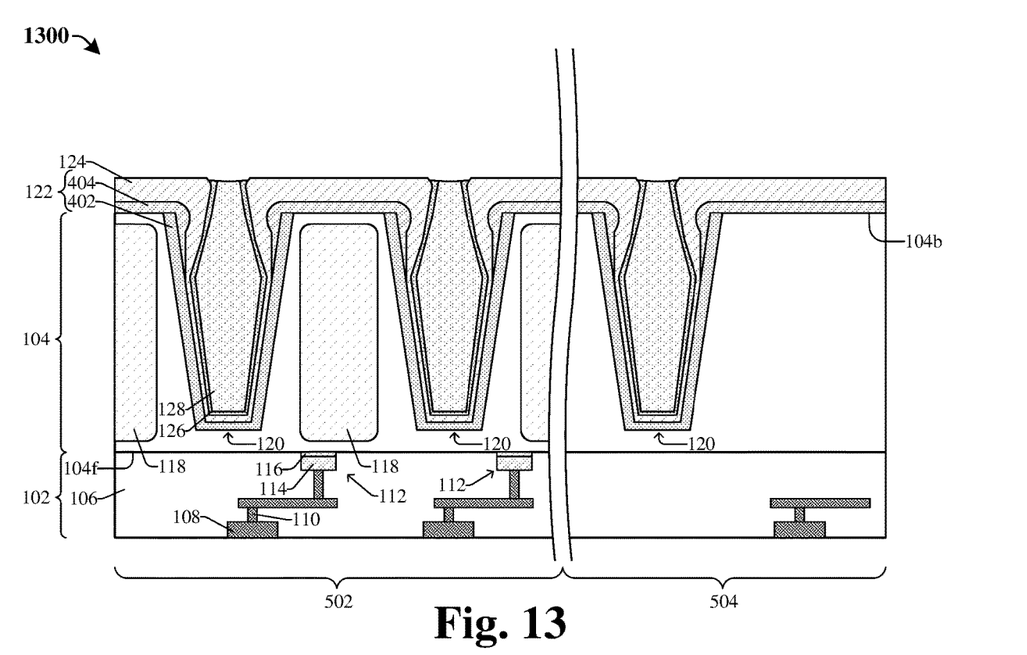

As illustrated in cross-sectional view 1300 of FIG. 13, a planarization process is performed on the metal core 128 and the conductive liner 126, thereby defining an isolation structure 120. In various embodiments, the planarization process may include performing a CMP process into the metal core 128 and the conductive liner 126 until a top surface of the second dielectric liner 124 is reached. In various embodiments, a process for forming the isolation structure 120 may include the processing steps illustrated and described in FIGS. 9-13.

Figure 14:
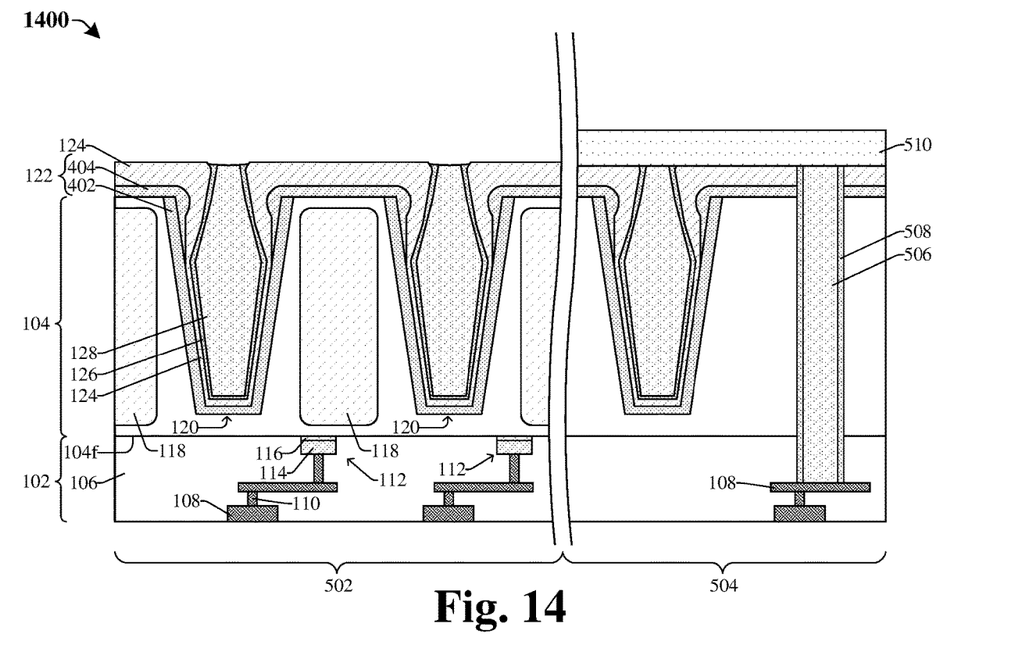

As illustrated in cross-sectional view 1400 of FIG. 14, a through substrate via (TSV) 506 is formed over a conductive wire 108 within the peripheral region 504. Further, a third dielectric liner 508 is formed within the substrate 104 and laterally encloses the TSV 506 and an upper conductive structure 510 is formed within the peripheral region 504 over the TSV 506 and the metal core 128. The upper conductive structure 510 electrically couples the metal core 128 to the TSV 506.

Figure 15:
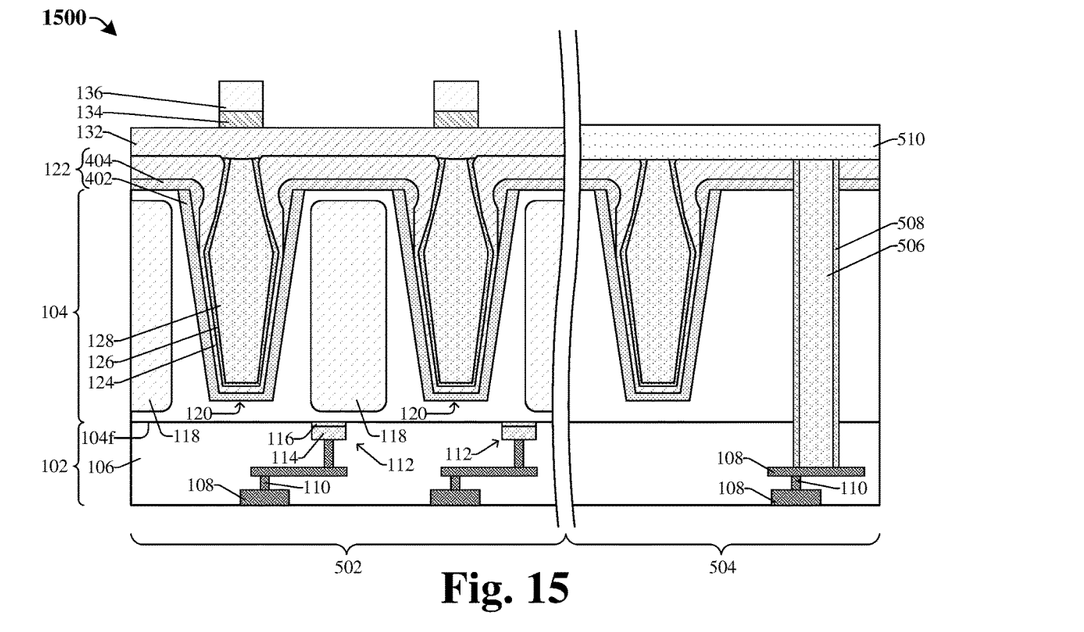

As illustrated in cross-sectional view 1500 of FIG. 15, an upper dielectric layer 132 is formed within the pixel array region 502 and over the isolation structure 120. In addition, a metal grid structure 134 and a dielectric grid structure 136 are formed over the upper dielectric layer 132 such that the metal grid structure 134 and the dielectric grid structure 136 overlie the metal core 128. In some embodiments, the upper dielectric layer 132 is formed by a PECVD process, a PEALD process, an ALD process, a PVD process, or another suitable growth or deposition process. In further embodiments, the upper dielectric layer 132 may be formed by a same deposition process as the second dielectric liner 124. The upper dielectric layer 132 may, for example, be or comprise an oxide, such as silicon dioxide, or the like and has a dielectric constant less than that of the first dielectric layer 402 and the second dielectric layer 404, respectively. A process for forming the metal grid structure 134 and the dielectric grid structure 136 includes: depositing (e.g., by PVD, CVD, ALD, etc.) a metal grid layer over the upper dielectric layer 132; depositing (e.g., by PVD, CVD, ALD, etc.) a dielectric grid layer over the metal grid layer; forming a masking layer (not shown) over the dielectric grid layer; patterning the metal grid layer and the dielectric grid layer according to the masking layer, thereby defining the metal grid structure 134 and the dielectric grid structure 136; and performing a removal process to remove the masking layer.

Figure 16:
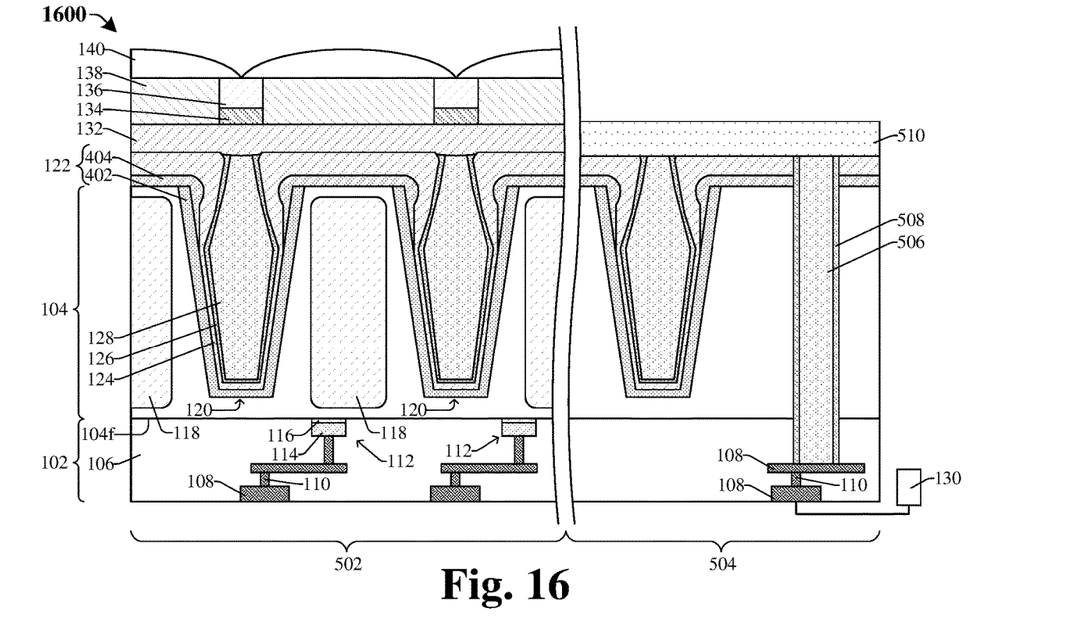

As illustrated in cross-sectional view 1600 of FIG. 16, a plurality of color filters 138 is formed over the plurality of photodetectors 118 and a plurality of micro-lenses 140 is formed over the plurality of color filters 138. In some embodiments, the color filters 138 and the micro-lenses 140 may be deposited by, for example, CVD, PVD, ALD, or another suitable deposition or growth process. In addition, a bias circuit 130 is formed electrically coupled to the metal core 128 and the substrate 104, where the bias circuit 130 is configured to apply a bias voltage (e.g., a negative bias voltage) to the metal core 128 by way of the interconnect structure, the TSV 506, and the upper conductive structure 510. In various embodiments, the bias voltage may be about −3 volts, within a range of about −20 volts to about +20 volts, or another suitable value. By virtue of the bias circuit 130 applying the bias voltage to the metal core 128, formation of a deep implant well (not shown) around the photodetectors 118 may be omitted and a full well capacity of the photodetectors 118 may be increased. This, in part, may decrease a number of processing steps performed in the method of FIGS. 7-16 and improves a performance of the photodetectors 118.

Figure 17:
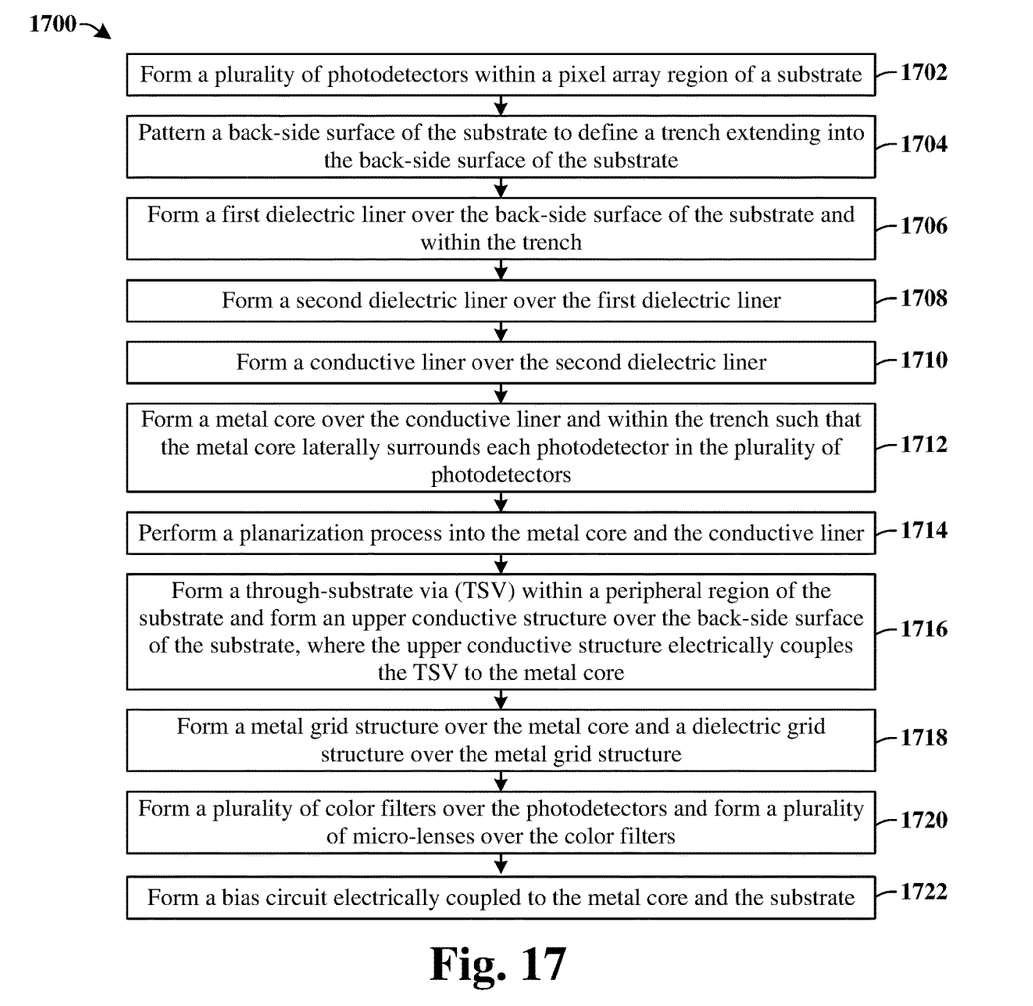
FIG. 17 illustrates a flowchart according to some embodiments of a method for forming an image sensor comprising an isolation structure laterally enclosing a plurality of photodetectors and a bias circuit configured to bias the isolation structure.

FIG. 17 illustrates some embodiments of a method 1700 of forming an image sensor comprising an isolation structure laterally enclosing a plurality of photodetectors and a bias circuit configured to bias the isolation structure according to the present disclosure. Although the method 1700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1702, a plurality of photodetectors is formed within a pixel array region of a substrate. FIG. 7 illustrates a cross-sectional view 700 corresponding to some embodiments of act 1702.

At act 1704, a back-side surface of the substrate is patterned to define a trench extending into the back-side surface of the substrate. FIG. 9 illustrates a cross-sectional view 900 corresponding to some embodiments of act 1704.

At act 1706, a first dielectric liner is formed over the back-side surface of the substrate and within the trench. FIG. 10 illustrates a cross-sectional view 1000 corresponding to some embodiments of act 1706.

At act 1708, a second dielectric liner is formed over the first dielectric liner. FIG. 11 illustrates a cross-sectional view 1100 corresponding to some embodiments of act 1708.

At act 1710, a conductive liner is formed over the second dielectric liner. FIG. 12 illustrates a cross-sectional view 1200 corresponding to some embodiments of act 1710.

At act 1712, a metal core is formed over the conductive liner and within the trench such that the metal core laterally surrounds each photodetector in the plurality of photodetectors. FIG. 12 illustrates a cross-sectional view 1200 corresponding to some embodiments of act 1712.

At act 1714, a planarization process is performed into the metal core and the conductive liner. FIG. 13 illustrates a cross-sectional view 1300 corresponding to some embodiments of act 1714.

At act 1716, a through-substrate via (TSV) is formed within a peripheral region of the substrate and an upper conductive structure is formed over the back-side surface of the substrate. The upper conductive structure electrically couples the TSV to the metal core. FIG. 14 illustrates a cross-sectional view 1400 corresponding to some embodiments of act 1716.

At act 1718, a metal grid structure is formed over the metal core and a dielectric grid structure is formed over the metal grid structure. FIG. 15 illustrates a cross-sectional view 1500 corresponding to some embodiments of act 1718.

At act 1720, a plurality of color filters is formed over the photodetectors and a plurality of micro-lenses is formed over the color filters. FIG. 16 illustrates a cross-sectional view 1600 corresponding to some embodiments of act 1720.

At act 1722, a bias circuit is formed that is electrically coupled to the metal core and the substrate. FIG. 16 illustrates a cross-sectional view 1600 corresponding to some embodiments of act 1722.

Accordingly, in some embodiments, the present disclosure relates to an image sensor comprising an isolation structure laterally enclosing a photodetector, where the isolation structure comprises a conductive liner and a metal core. A bias circuit is electrically coupled to the metal core and is configured to apply a bias voltage to the metal core.

In some embodiments, the present application provides an image sensor including: a semiconductor substrate comprising a front-side surface opposite a back-side surface; a plurality of photodetectors disposed in the semiconductor substrate; and an isolation structure extending into the back-side surface of the semiconductor substrate and disposed between adjacent photodetectors, wherein the isolation structure includes a metal core, a conductive liner disposed between the semiconductor substrate and the metal core, and a first dielectric liner disposed between the conductive liner and the semiconductor substrate, wherein the metal core comprises a first metal material and the conductive liner comprises the first metal material and a second metal material different from the first metal material.

In some embodiments, the present application provides an image sensor including: a semiconductor substrate comprising sidewalls that define a trench; a plurality of photodetectors disposed laterally within a pixel array region of the semiconductor substrate; an isolation structure disposed within the trench of the semiconductor substrate, wherein the isolation structure laterally encloses the plurality of photodetectors, wherein the isolation structure comprises a metal core and a conductive liner disposed between the sidewalls of the semiconductor substrate defining the trench and the metal core; a metal grid structure overlying the isolation structure; and a bias circuit electrically coupled to the metal core and configured to apply a bias voltage to the metal core.

In some embodiments, the present application provides a method for forming an image sensor, the method includes: forming a plurality of photodetectors within a semiconductor substrate; patterning a back-side surface of the semiconductor substrate to define a trench extending into the back-side surface of the semiconductor substrate; depositing a first dielectric liner over the semiconductor substrate such that the first dielectric liner lines the trench; forming an isolation structure in the trench, wherein forming the isolation structure comprises depositing a conductive liner over the first dielectric liner and depositing a metal core over the conductive liner, wherein the metal core comprises a first metal material, and wherein the conductive liner comprises the first metal material and a second conductive material different than the first metal material; and performing a planarization process into the metal core and the conductive liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
   forming a plurality of photodetectors within a semiconductor substrate;
   patterning a back-side surface of the semiconductor substrate to define a trench extending into the back-side surface of the semiconductor substrate;
   depositing a first dielectric liner over the semiconductor substrate such that the first dielectric liner lines the trench;
   forming an isolation structure in the trench, wherein forming the isolation structure comprises depositing a conductive liner over the first dielectric liner and depositing a metal core over the conductive liner, wherein the metal core comprises a first metal material, wherein the conductive liner comprises the first metal material and a second conductive material different than the first metal material, wherein the conductive liner is deposited by an atomic layer deposition process and the metal core is deposited by a chemical vapor deposition process, wherein a first plane above the semiconductor substrate traverses the isolation structure across a first lateral distance, wherein a second plane traverses the isolation structure across a maximum lateral distance of the isolation structure, wherein a third plane traverses a bottom surface of the isolation structure across a second lateral distance, wherein a first vertical distance between the first plane and the second plane is less than a second vertical distance between the second plane and the third plane, and wherein the first lateral distance is less than the maximum lateral distance of the isolation structure; and
   performing a planarization process into the metal core and the conductive liner.

2. The method of claim 1, further comprising:
   forming a conductive grid structure over the back-side surface of the semiconductor substrate such that the conductive grid structure directly overlies and is aligned with the metal core of the isolation structure.

3. The method of claim 1, wherein a first distance between the metal core and the first dielectric liner at a first point vertically aligned with the back-side surface of the semiconductor substrate is greater than a second distance between the metal core and the first dielectric liner at a second point vertically aligned with a bottom surface of the metal core.

4. The method of claim 1, further comprising:
   forming a second dielectric liner between the conductive liner and the first dielectric liner, wherein a dielectric constant of the second dielectric liner is less than a dielectric constant of the first dielectric liner.

5. The method of claim 4, wherein a first thickness of the second dielectric liner over the back-side surface of the semiconductor substrate is greater than a second thickness of the second dielectric liner disposed along a sidewall of the conductive liner.

6. The method of claim 1, wherein top surfaces of the metal core and the conductive liner are vertically above the back-side surface of the semiconductor substrate after the planarization process.

7. The method of claim 1, further comprising:
forming an interconnect structure along a front-side surface of the semiconductor substrate, wherein the interconnect structure comprises a conductive wire;
forming a through substrate via (TSV) extending through the semiconductor substrate to contact the conductive wire; and
forming an upper conductive structure over the back-side surface of the semiconductor substrate, wherein the upper conductive structure electrically couples the metal core to the TSV.

8. The method of claim 1, wherein the first metal material is aluminum.

9. The method of claim 2, wherein the conductive grid structure comprises a first grid segment directly overlying a first segment of the isolation structure, wherein a width of the first grid segment is less than a width of the first segment of the isolation structure.

10. A method for forming an image sensor, the method comprising:
forming a plurality of photodetectors within a semiconductor substrate;
patterning a top surface of the semiconductor substrate to define a trench extending into the top surface of the semiconductor substrate and spaced between adjacent photodetectors in the plurality of photodetectors;
forming an isolation structure in the trench, wherein the isolation structure comprises a metal core and a conductive liner disposed between the semiconductor substrate and the metal core, wherein a top surface of the isolation structure is vertically above the top surface of the semiconductor substrate, wherein a width of the metal core increases across a first vertical distance from the top surface of the isolation structure to a first point below the top surface of the semiconductor substrate, and wherein the width of the metal core continuously decreases across a second vertical distance from the first point to a bottom surface of the metal core, wherein the second vertical distance is greater than the first vertical distance; and
forming a conductive grid structure over the isolation structure, wherein the conductive grid structure is aligned with the metal core of the isolation structure.

11. The method of claim 10, further comprising:
forming a first dielectric liner between the conductive liner and the semiconductor substrate, wherein the first dielectric liner comprises a curved vertical surface disposed along a sidewall of the semiconductor substrate defining a portion of the trench.

12. The method of claim 11, wherein the curved vertical surface extends from above the top surface of the semiconductor substrate to a point below the top surface of the semiconductor substrate.

13. The method of claim 11, further comprising:
forming a second dielectric liner between the first dielectric liner and the conductive liner, wherein the second dielectric liner continuously extends from a bottom surface of the conductive liner to a top surface of the conductive liner.

14. The method of claim 13, wherein the first dielectric liner comprises a first material and the second dielectric liner comprises a second material different from the first material.

15. The method of claim 10, further comprising:
forming a dielectric grid structure on the conductive grid structure, wherein a height of the dielectric grid structure is greater than a height of the conductive grid structure.

16. The method of claim 10, further comprising:
forming a plurality of color filters over the photodetectors and between sidewalls of the conductive grid structure; and
forming a plurality of micro-lenses over the plurality of color filters.

17. A method for forming an image sensor, the method comprising:
forming a plurality of photodetectors within a semiconductor substrate, wherein the semiconductor substrate has a first surface opposite a second surface;
forming an interconnect structure along the first surface of the semiconductor substrate;
patterning the second surface of the semiconductor substrate to define a trench extending into the second surface of the semiconductor substrate,
forming a first dielectric liner over the semiconductor substrate and lining the trench;
forming a second dielectric liner over the semiconductor substrate and along the first dielectric liner, wherein a first distance between opposing sidewalls of the second dielectric liner laterally separated by a photodetector and above the second surface is less than a second distance between the opposing sidewalls of the second dielectric liner at a point below the second surface and above a top of the photodetector;
depositing a conductive liner within the trench along the second dielectric liner, wherein a thickness of the conductive liner is less than a thickness of the first dielectric liner, wherein the conductive liner comprises titanium aluminum carbide;
depositing a metal core over the conductive liner and within the trench, wherein the metal core comprises aluminum; and
performing a planarization process on the conductive liner and the metal core.

18. The method of claim 17, wherein the trench is defined by opposing sidewalls and a lower surface of the semiconductor substrate, wherein the first dielectric liner comprises a first dielectric layer and a second dielectric layer, wherein the first dielectric layer is disposed along the opposing sidewalls and the lower surface of the semiconductor substrate, wherein the second dielectric layer continuously extends from the second surface to a sidewall of the first dielectric layer.

19. The method of claim 18, wherein the second dielectric layer comprises protrusions extending below the second surface.

20. The method of claim 18, wherein the first dielectric layer is formed by a first deposition process and the second dielectric layer is formed by a second deposition process different from the first deposition process.

* * * * *